United States Patent [19]

Connolly et al.

[11] Patent Number: 4,523,318
[45] Date of Patent: Jun. 11, 1985

[54] SEMICONDUCTOR LASER HAVING HIGH MANUFACTURING YIELD

[75] Inventors: John C. Connolly, Cranbury; Dan Botez, Mount Holly, both of N.J.

[73] Assignee: RCA Corporation, Princeton, N.J.

[21] Appl. No.: 437,840

[22] Filed: Oct. 29, 1982

[51] Int. Cl.³ .............................................. H01S 3/19
[52] U.S. Cl. ...................................... 372/48; 357/17; 357/60; 372/44; 372/45
[58] Field of Search ...................... 372/44, 45, 46, 48; 357/16, 17, 60

[56] References Cited

U.S. PATENT DOCUMENTS

| | | | |
|---|---|---|---|
| 3,753,801 | 8/1973 | Lockwood et al. | 148/171 |
| 4,050,964 | 9/1977 | Rode | 357/60 |
| 4,215,319 | 7/1980 | Botez | 372/46 |
| 4,347,486 | 8/1982 | Botez | 372/46 |

Primary Examiner—James W. Davie
Attorney, Agent, or Firm—Birgit E. Morris; Donald S. Cohen; William J. Burke

[57] ABSTRACT

A semiconductor laser wherein the major surface of a substrate having a pair of channels therein is misoriented from a member of the {100} family of crystallographic planes by a tilt angle between about 0.2° and 1.5°. The misorientation angle of the substrate surface with respect to the axis of the channels is between about 5° and 45°.

7 Claims, 2 Drawing Figures

SEMICONDUCTOR LASER HAVING HIGH MANUFACTURING YIELD

The United States Government has rights in this invention pursuant to a Government Contract.

The invention relates to a semiconductor laser having high manufacturing yield through proper choice of the substrate orientation.

BACKGROUND OF THE INVENTION

Botez in U.S. Pat. No. 4,347,486, incorporated herein by reference, has disclosed a large optical cavity constricted double heterostructure semiconductor laser comprising a body of semiconductor material which includes a substrate with a pair of spaced apart channels in a major surface thereof with a mesa therebetween. A first confinement layer overlies the surface of the substrate, the mesa and the surfaces of the channels. A light propagation region composed of an active layer and an adjacent guide layer overlies the first confinement layer and a second confinement layer overlies the active layer. The active layer is the recombination region of the laser with laser light generated therein. The light beam so generated propagates in both the thin active layer and, primarily, in the relatively thicker guide layer. This laser has excellent selectivity against lasing of higher order modes of the structure since the waveguide formed by the light propagation region in the lateral direction (the direction in the plane of the layers and perpendicular to the axis of the channels) exhibits high loss for these modes.

We have found, however, that the manufacturing yield of such lasers fabricated from a wafer is very low. It would be desirable to have a laser structure which has a high manufacturing yield to minimize the cost of such devices.

SUMMARY OF THE INVENTION

The invention is a semiconductor laser having improved manufacturing yield where the improvement comprises the major surface of the substrate upon which the layers are deposited being misoriented from a member of the {100} family of crystallographic planes by an angle between about 0.2° and 1.5° with the misorientation angle being at an angle between about 5° and 45° from the axis of the channels.

DETAILED DESCRIPTION OF THE PREFERRED EMBODIMENTS

Figure 1:
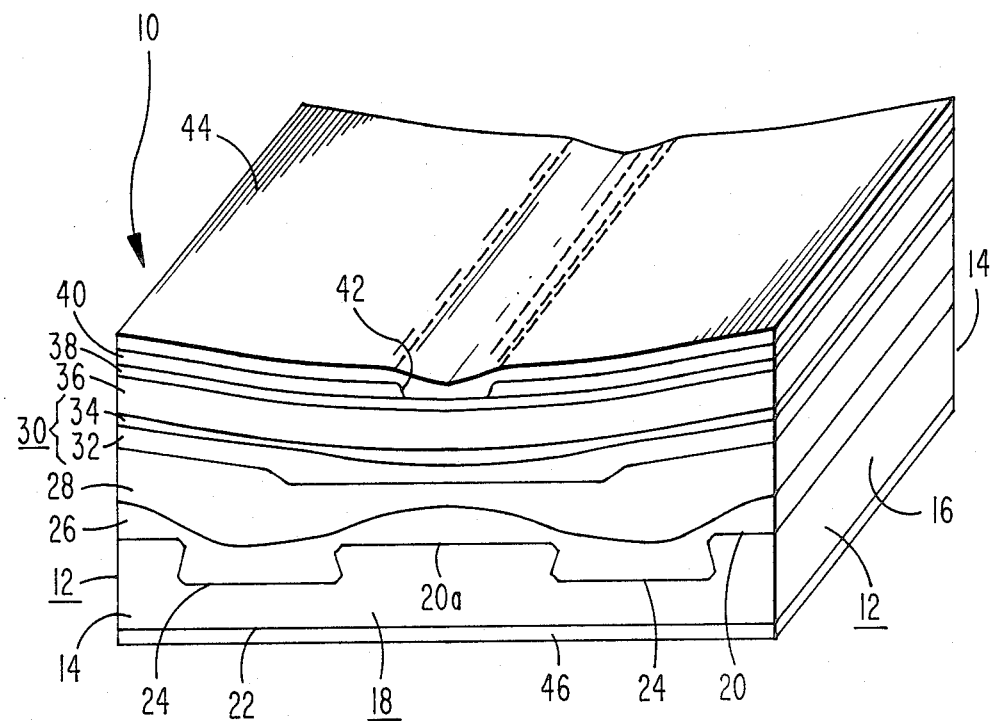
FIG. 1 is a perspective view of the semiconductor laser of the invention.

In FIG. 1 a semiconductor laser 10 is shown to include a body 12 of semiconductor material, typically Group III-V compounds and alloys of such compounds, in the form of a parallelopiped. The body 12 has spaced, parallel mirror facets 14 which are partially reflecting of light with at least one of the mirror facets 14 being partially transparent so that light may be emitted therefrom. The body 12 also includes spaced parallel side surfaces 16 which extend between and are perpendicular to the mirror facets 14.

The semiconductor body 12 comprises a substrate 18 having spaced, parallel major surfaces 20 and 22 which extend between and are substantially perpendicular to both the mirror facets 14 and the side surfaces 16. In the major surface 20 are a pair of spaced channels 24 which extend between the mirror facets 14. A portion of the major surface between the channels 24 forms a mesa 20a. A buffer layer 26 overlies the major surface 20, the mesa 20a and partially fills the channels 24. A first confinement layer 28 overlies the buffer layer 26. A light propagation region 30 overlies the first confinement layer 28 and is composed of a guide layer 32 overlying the first confinement layer 30 and an adjacent active layer 34. A second confinement layer 36 overlies the light propagation region 30 and a capping layer 38 overlies the second confinement layer 36. An electrically insulating layer 40 overlies the capping layer and has an opening 42 extending therethrough in the form of a stripe over the mesa 20a. A first electrically conducting layer 44 overlies the electrically insulating layer 40 and the portion of the capping layer 38 in the region of the opening 42. A second electrically conducting layer 46 overlies the second major surface 22 of the substrate 18. The electrically conducting layers 44 and 46 form the electrical contacts to the laser 10.

The substrate 18, the buffer layer 26 and the first confinement layer 28 are of one conductivity type, either p or n-type, and the second confinement layer 36 and the capping layer 38 are of the opposite conductivity type. It is to be understood that conductivity types of each of these layers may be reversed so long as the relationships of the conductivity types of the various layers are maintained.

The bulk refractive index of the active layer 34 is greater than that of the guide layer 32 which, in turn, is greater than that of either the first and second confinement layers 28 and 36 respectively.

The various epitaxial layers may be deposited on the substrate 18 using the well-known techniques of liquid phase epitaxy as disclosed by Botez in U.S. Pat. No. 4,215,319 and by H. F. Lockwood et al. in U.S. Pat. No. 3,753,801, both of which are incorporated herein by reference. In liquid phase epitaxy, the local growth rate of a portion of a particular layer will vary with the local curvature of the surface upon which it is grown. The greater the local positive curvature of the surface, i.e., the greater the concavity of the surface when viewed from over the surface, the higher the local growth rate will be.

Figure 2:
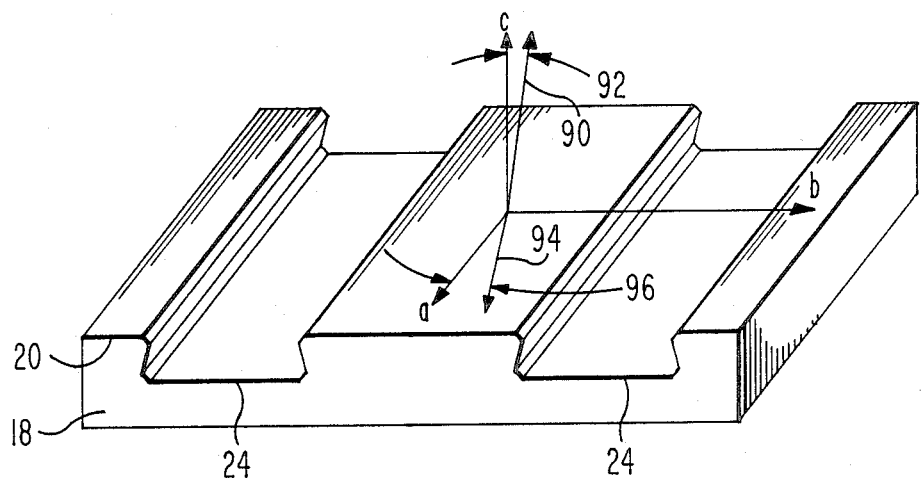
FIG. 2 is a perspective view of a substrate having channels in a surface thereof and illustrating the misorientation of a substrate and its direction.

We have found that there is strong dependence of the yield of devices from a wafer which emit high output power in a single lateral and transverse mode depending upon the tilt angle between the major surface 20 and a {100} crystallographic plane and upon the misorientation angle between the misorientation direction in the surface 20 and the axis of the channels. The misorientation direction is defined as the normal to the line of intersection of a {100} plane with the major surface 20 of the substrate 18 which lies in the major surface 20. This is shown schematically in FIG. 2 where the identification of the elements is the same as that of FIG. 1. The substrate 18 has a pair of channels 24 in the surface 20. A coordinate system is superposed on the drawing of the substrate with the a-axis parallel to the channel axis and in the surface 20. The b-axis is in the surface 20 and perpendicular to the a-axis. The c-axis is perpendicular to the surface 20. The direction 90 is the normal to the surface of a {100} crystallographic plane and the angle 92 is the tilt angle between the normal to the particular {100} crystallographic plane and the substrate surface. The direction 94 in the surface 20 is the normal to the intersection of the substrate surface and the {100} crystallographic plane. The angle 96 between the direction 94 and the a-axis is the misorientation angle.

The tilt angle and the optimal misorientation angle are related to one another. As the tilt angle increases the optimal misorientation angle also increases. The critical dependence of the yield on the tilt angle and the misorientation angle arises from the fact that the tendency for preferential growth on surfaces having the greatest positive curvature is greatest at small tilt angles and decreases with increasing tilt angle. At a tilt angle of 0° (the substrate surface and the (001) plane being coincident) the growth tends to be unstable, forming steps on the surface of a deposited layer. For tilt angles close to 0° the tendency for growth on concave portions of the surfaces is greatest and decreases with increasing tilt angle. Thus, the tapering of the active and guide layers in the lateral direction is greatest at small tilt angles and decreases with increasing tilt angle. To maintain the same degree of lateral tapering in both the active and guide layers with increasing tilt angle, the misorientation angle must also increase. The increase in the misorientation angle maintains the desired lateral taper in decreasing thickness of the active layer and the lateral taper in increasing thickness of the guide layer.

Typically, the tilt angle of the (001) plane from the substrate surface is between about 0.2° and 1.5° and the misorientation angle is between about 5° and 45° to the axis of the channels. For a tilt angle between about 0.3° and 0.7° the optimal misorientation angle is typically between about 5° and 25° while for a tilt angle between about 0.8° and 1.2° the optimal misorientation angle is typically between about 25° and 45°. Preferably, for a tilt angle of about 0.5° the misorientation angle is about 20° while for a tilt angle of about 1° the misorientation angle is about 35°.

The substrate orientation was measured by x-ray diffraction techniques. The accuracy of the tilt angle measurement was ±0.03° and the accuracy of the misorientation angle measurement was ±3°.

The channels 24 are shown as having a dove-tailed shape which results from the channel axis being substantially parallel to a [100] crystallographic direction. Alternatively, the channels may have a different shape, for example, a U, Vee or rectangular shape which results when a different crystallographic axis or chemical etchant is used. The channels are formed using standard photolithographic and chemical etching techniques as disclosed by Botez in U.S. Pat. No. 4,215,319.

The buffer layer 26 is typically composed of the same material as the substrate 18 and is between about 1 and 3 micrometers ($\mu$m) thick over the mesa 20a. The first confinement layer 28 is typically composed of n-type $Al_wGa_{1-w}As$ where the fractional concentration w of aluminum is between about 0.25 and 0.4 and is typically about 0.35. This layer is typically between about 1 and 4 $\mu$m thick over the mesa 20a. The guide layer 32 is typically composed of n-type $Al_xGa_{1-x}As$ where the fractional concentration x of Al is less than that of the first confinement layer 28 and greater than that of the active layer 34 and is typically between about 0.1 and 0.3 and preferably about 0.2. The guide layer 32 typically has a thickness over the mesa 20a between about 0.5 and 2 $\mu$m. The active layer 34 is composed of $Al_yGa_{1-y}As$ where the fractional concentration y of Al is less than the concentration in the guide layer 32 and is typically between about 0 and about 0.15. Typically, this layer is between about 0.1 and 0.3 $\mu$m thick over the mesa 20a. The preferred difference in Al concentration between the guide and active layers is about 0.15. The second confinement layer 36 is typically composed of p-type $Al_zGa_{1-z}As$ where the fraction concentration z of Al is between about 0.3 and 0.5 and is preferably about 0.4. This layer is typically between about 1 and 3 $\mu$m thick over the mesa 20a. The capping layer 38 is typically between about 0.2 and 1.0 $\mu$m thick and is composed of p-type GaAs.

The electrically insulating layer 40 is preferably composed of silicon dioxide which is deposited on the capping layer 38 by pyrolytic decomposition of silane in oxygen or water vapor. The opening 42 is formed using standard photolithographic mask techniques and chemical etching processes. The electrical contact 44 is deposited by sequential vacuum evaporation over the electrically insulating layer 40 and the capping layer 38 in the region of the opening 42 and is preferably composed of titanium, platinum and gold. The second electrical contact 46 may be formed by vacuum deposition and sintering of silver-tin followed by an electro-plated gold layer.

Greatly improved yields of devices having high output power in a single lateral and transverse mode were obtained using substrates having the preferred misorientations disclosed herein. Comparisons of the yields of useful devices were made using wafers having the proper thickness and taper of the active and guide layers and the optimum difference in aluminum concentration between the active and guide layers. For a tilt angle of 0° and any misorientation angle the yield of useful devices was between 0 and 5 percent. For a tilt angle of 0.5° and a misorientation angle of 17° the yield was between 10 and 20 percent. For a tilt angle of 1.0° and a misorientation angle of 35° the yield was between 30 and 60 percent.

We claim:

1. In a laser comprising a body of semiconductor material, said body including a substrate having a pair of channels in a first major surface thereof with a mesa therebetween, a first confinement layer overlying the first major surface, the mesa and partially filling the channels; a light propagation region, comprising an active layer, overlying the first confinement layer; and a second confinement layer overlying the light propagation region:

the improvement which comprises the first major surface of the substrate being misoriented from a member of the {100} family of crystallographic planes by a tilt angle between about 0.2° and 1.5° with a misorientation angle of between about 5° and 45°.

2. The laser of claim 1 wherein the tilt angle is between about 0.3° and 0.7° and the misorientation angle is between about 5° and 25°.

3. The laser of claim 2 wherein the tilt angle is about 0.5° and the misorientation angle is about 20°.

4. The laser of claim 1 wherein the tilt angle is between about 0.8° and 1.2° and the misorientation angle is between about 25° and 45°.

5. The laser of claim 4 wherein the tilt angle is about 1° and the misorientation angle is about 35°.

6. The laser of claim 1 wherein the light propagation region further comprises a guide layer adjacent to the active layer.

7. The laser of claim 6 wherein the guide layer overlies the first confinement layer and the active layer overlies the guide layer.

* * * * *